(12) United States Patent
Harris et al.

(10) Patent No.: US 7,485,512 B2
(45) Date of Patent: Feb. 3, 2009

(54) METHOD OF MANUFACTURING AN ADAPTIVE AlGAN BUFFER LAYER

(75) Inventors: Christopher Harris, Taby (SE);
Thomas Gehrke, Manassas Park, VA (US); T. Warren Weeks, Jr., Charleston, SC (US); Cem Basceri, Reston, VA (US); Elif Berkman, Reston, VA (US)

(73) Assignee: Cree, Inc., Durham, NC (US)

( * ) Notice: Subject to any disclaimer, the term of this patent is extended or adjusted under 35 U.S.C. 154(b) by 90 days.

(21) Appl. No.: 11/474,431

(22) Filed: Jun. 26, 2006

(65) Prior Publication Data

US 2006/0281238 A1 Dec. 14, 2006

Related U.S. Application Data

(63) Continuation-in-part of application No. 11/147,342, filed on Jun. 8, 2005.

(51) Int. Cl.
*H01L 21/338* (2006.01)

(52) U.S. Cl. .................. 438/167; 438/46; 438/93; 438/172; 257/194; 257/195; 257/196; 257/472

(58) Field of Classification Search ......... 438/220–222, 438/234–238, 473, 478–509, 46, 93, 167, 438/172; 257/194, 195, 196, 472
See application file for complete search history.

(56) References Cited

U.S. PATENT DOCUMENTS

| | | | |
|---|---|---|---|
| 4,424,525 A | 1/1984 | Mimura | |
| 5,105,241 A | 4/1992 | Ando | |
| 5,381,027 A | 1/1995 | Usagawa et al. | |
| 5,786,606 A * | 7/1998 | Nishio et al. | 257/103 |
| 5,821,170 A | 10/1998 | Kingbeil et al. | |
| 5,929,467 A | 7/1999 | Kawai et al. | |
| 6,100,549 A | 8/2000 | Weitzel et al. | |
| 6,140,169 A | 10/2000 | Kawai et al. | |
| 6,150,680 A | 11/2000 | Eastman et al. | |
| 6,504,176 B2 | 1/2003 | Kitabatake et al. | |
| 6,534,801 B2 * | 3/2003 | Yoshida | 257/192 |
| 6,544,867 B1 * | 4/2003 | Webb et al. | 438/478 |
| 6,765,242 B1 | 7/2004 | Chang et al. | |

(Continued)

OTHER PUBLICATIONS

Gaska et al. High Temperature Performance of AlGaN/GaN HFET's on SiC Substrates. IEEE Electron Device Letters, vol. 18, No. 10 (1997).

(Continued)

*Primary Examiner*—Ha Tran T Nguyen
*Assistant Examiner*—Daniel Whalen
(74) *Attorney, Agent, or Firm*—Volentine & Whitt, P.L.L.C.

(57) ABSTRACT

A method of compensating resistivity of a near-surface region of a substrate includes epitaxially growing a buffer layer on the substrate, wherein the buffer is grown as having a dopant concentration as dependent on resistivity and conductivity of the substrate, so as to deplete residual or excess charge within the near-surface region of the substrate. The dopant profile of the buffer layer be smoothly graded, or may consist of sub-layers of different dopant concentration, to also provide a highly resistive upper portion of the buffer layer ideal for subsequent device growth. Also, the buffer layer may be doped with carbon, and aluminum may be used to getter the carbon during epitaxial growth.

24 Claims, 7 Drawing Sheets

U.S. PATENT DOCUMENTS

| | | |
|---|---|---|
| 6,777,315 B1 | 8/2004 | Van Nostrand |
| 7,084,441 B2 | 8/2006 | Saxler |
| 2001/0015437 A1* | 8/2001 | Ishii et al. ............ 257/12 |
| 2004/0041169 A1 | 3/2004 | Ren et al. |
| 2005/0194602 A1 | 9/2005 | Moon et al. |
| 2006/0019435 A1 | 1/2006 | Sheppard et al. |
| 2006/0043379 A1* | 3/2006 | Zhang et al. ............ 257/77 |
| 2006/0054917 A1 | 3/2006 | Lee et al. |
| 2006/0054925 A1 | 3/2006 | Kikkawa |
| 2006/0073621 A1 | 4/2006 | Kneissel et al. |
| 2006/0278892 A1 | 12/2006 | Harris et al. |
| 2006/0281238 A1 | 12/2006 | Harris et al. |
| 2006/0281284 A1* | 12/2006 | Harris et al. ............ 438/478 |
| 2007/0032046 A1 | 2/2007 | Dmitriev et al. |

OTHER PUBLICATIONS

C. Theodoropoulos et al.; Design of Gas Inlets for the Growth of Gallium Nitride by Metalorganic Vapor Phase Epitaxy; Journal of Crystal Growth; 2000.

C. Poblenz et al; Effect of Carbon Doping on Buffer Leakage in AlGaN/GaN High Electron Mobility Transistors; J. Vac. Sci. Technol. B22 May, Jun. 2004.

* cited by examiner

METHOD OF MANUFACTURING AN ADAPTIVE AlGAN BUFFER LAYER

This is a continuation-in-part application of U.S. Ser. No. 11/147,342, filed on Jun. 8, 2005, which is incorporated herein by reference.

BACKGROUND OF THE INVENTION

1. Field of the Invention

The present invention relates to a method of manufacturing aluminum gallium nitride/gallium nitride (AlGaN/GaN) high electron mobility devices for use in high-power, high-frequency device applications, to controlling or compensating charge within the channel of such high electron mobility devices, and the use of buffer layers to adaptively improve substrate resistivity.

2. Background

The aluminum gallium nitride/gallium nitride hetero-interface or heterojunction creates a planar region of high charge and high mobility electrons called a two-dimensional electron gas (2DEG), and is commonly used in high electron mobility devices. However, typical performance problems with gallium nitride based high electron mobility devices include dispersion related to unintentional traps in the nominally undoped or intrinsic gallium nitride buffer layer. These traps result in reduced channel charge in the two dimensional electron gas, current slump during device operation and reduced device lifetimes, among other problems. Also, AlGaN/GaN high electron mobility devices are planar growth structures that are typically depletion-mode devices that are normally-ON in their unbiased state, so that electrical current flows between source and drain contacts even when voltage is not applied to a corresponding gate contact. For electrical power switching applications, normally-OFF or enhancement-mode devices are preferable, such that charge does not flow between source and drain contacts in absence of applied voltage to the corresponding gate contact. Thus, there is a need to provide high electron mobility devices having improved performance, and also normally-OFF high electron mobility devices having improved performance.

Another performance problem that impacts high electron mobility devices is current leakage. To help reduce the impact of current leakage, there is a desire to manufacture high electron mobility devices on substrates having high resistivity in a range of $10^7$-$10^{12}$ ohms/cm. However, high resistivity substrates are expensive, and process yields are low. This contributes to the overall expense of high electron mobility devices. Thus, a cost-effective, high yield approach for providing high resistivity substrates is needed.

SUMMARY

In accordance with an exemplary embodiment, a method of manufacturing a heterojunction device includes in combination forming a first layer of p-type $Al_xGa_{(1-x)}N$; forming a second layer of undoped GaN on the first layer; and forming a third layer of nominally undoped $Al_xGa_{(1-x)}N$ on the second layer, to provide an electron gas between the second and third layers.

In accordance with a further exemplary embodiment, a method of manufacturing a double heterojunction device includes in combination forming a first layer of intrinsic GaN having a first surface and a second surface opposite the first surface; forming a second layer of nominally undoped $Al_xGa_{(1-x)}N$ on the first surface of the first layer, to provide an electron gas between the first and second layers, the electron gas comprised of negative charge provided by the second layer; and forming a third layer of p-type $Al_xGa_{(1-x)}N$ on the second surface of the first layer, that provides positive charge to the first layer to neutralize negative charge within the electron gas.

In accordance with a still further exemplary embodiment, a method of compensating resistivity of a near-surface region of a substrate includes providing the substrate; and epitaxially growing a buffer layer on the substrate, the buffer layer being grown as having a dopant concentration responsive to a resistivity and a conductivity type of the substrate, to deplete residual charge within the near-surface region of the substrate, wherein the substrate has n-type conductivity, and the buffer layer is doped with a p-type dopant at a dopant concentration responsive to the resisitivity and the n-type conductivity of the substrate, and wherein the buffer layer is doped with carbon, and aluminum is used to getter the carbon during said epitaxially growing a buffer layer.

In accordance with another exemplary embodiment, a method of adaptively controlling resistivity of a near-surface region of a substrate includes determining a conductivity type and initial resistivity of the substrate; selecting a target resistivity for the substrate; and epitaxially growing a buffer layer on the substrate, wherein a dopant concentration of the buffer layer is selected responsive to the conductivity type and the initial resistivity of the substrate to deplete residual charge within the substrate, so that the initial resistivity of near-surface region of the substrate is changed to be substantially the target resistivity, wherein the substrate has n-type conductivity, and the buffer layer is doped with a p-type dopant at a dopant concentration responsive to the initial resistivity and the n-type conductivity of the substrate, and wherein the buffer layer is doped with carbon, and aluminum is used to getter the carbon during said epitaxially growing a buffer layer.

BRIEF DESCRIPTION OF THE DRAWINGS

The above and other objects and features of the present invention will become apparent from the following description of the preferred embodiments made in conjunction with the accompanying drawings, in which.

DETAILED DESCRIPTION

Figure 1:
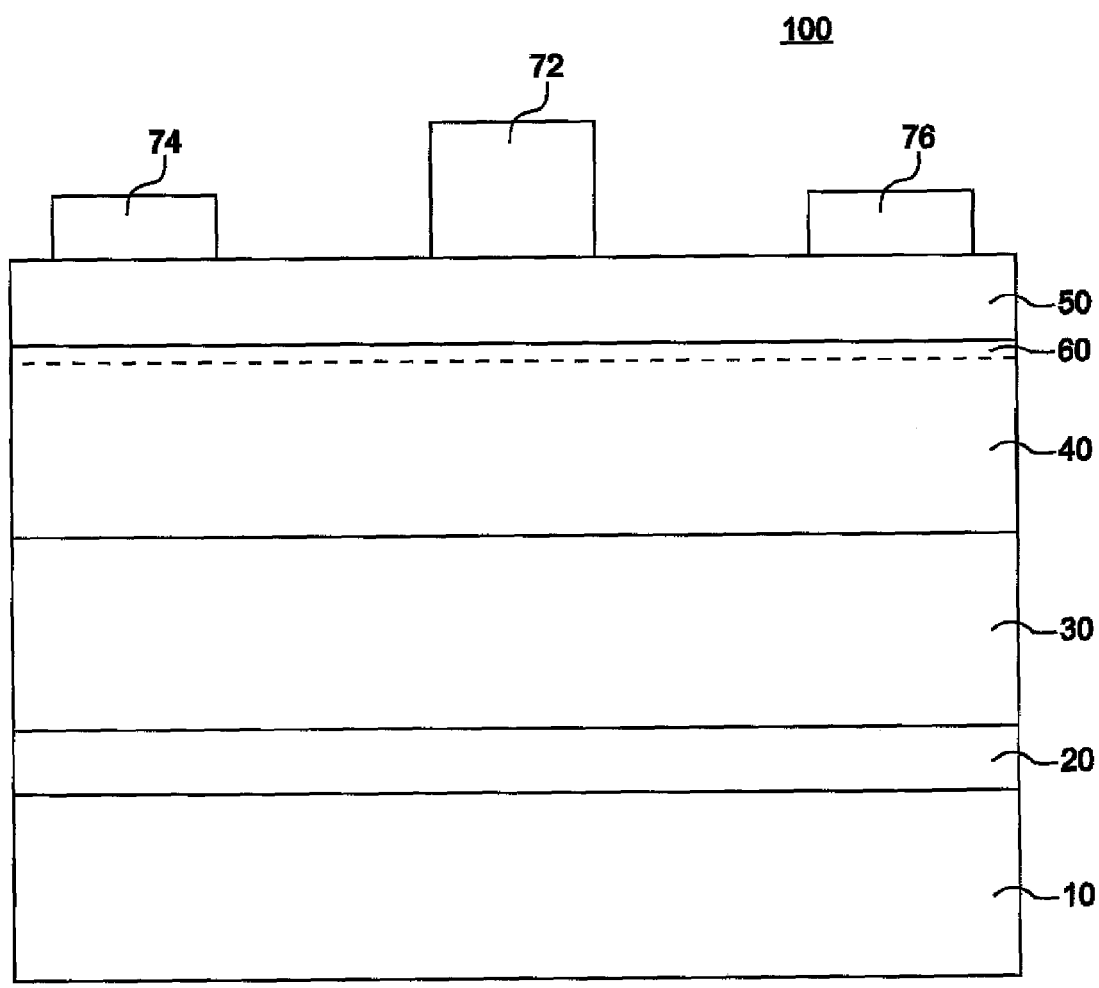
FIG. 1 illustrates a cross-section of a normally-ON depletion-mode high electron mobility device of a first embodiment.

The present invention will now be described more fully with reference to the accompanying drawings, in which preferred embodiments of the invention are shown. This invention may, however, be embodied in many different forms and should not be construed as limited to the embodiments set forth herein. Rather, the embodiments as described are provided so that this disclosure will be thorough and complete and will fully convey the concept of the invention to those skilled in the art. In the drawings, the shapes of elements are exaggerated for clarity, and are not necessarily drawn to scale, and like reference numerals are used to refer to like elements throughout the application.

FIG. 1 illustrates a normally-ON gallium nitride (GaN) high electron mobility device 100 of a first embodiment. In this particular embodiment, a high electron mobility transistor (HEMT) is described. However, it should be readily understood in view of the following description, that the principles of this invention may also be contemplated as applicable for field effect transistors including metal semiconductor field effect transistors (MESFETs), metal insulator field effect transistors (MISFETs) or metal oxide field effect transistors (MOSFETs), and for bipolar junction transistors (BJTs) and light emitting diodes (LEDs), for example. Thus, the following should not be construed as limited to the device structures as described.

As illustrated in FIG. 1, the high electron mobility device 100 includes a buffer layer 20 formed on substrate 10. Buffer layer 20 may be GaN, AlGaN, or aluminum nitride (AlN) and provides an interface from the non-GaN substrate to a GaN based active structure. Buffer layer 20 reduces defect concentration in the active device layers. Substrate 10 may be a semi-insulating substrate such as silicon carbide (SiC), silicon (Si) or sapphire. Buffer layer 20 may be considered as part of substrate 10, whereby the remaining layers as formed on buffer layer 20 may be considered as device layers of the structure. Typically, buffer layer 20 and substrate 10 may respectively have thickness in the range of about 1-5 um.

A p-type aluminum gallium nitride ($Al_xGa_{(1-x)}N$) layer 30 is epitaxially grown on buffer layer 20. Thereafter, an intrinsic or nominally undoped gallium nitride (GaN) layer 40 is epitaxially grown on p-type AlGaN layer 30. GaN layer 40 is intrinsic (nominally undoped or unintentionally doped), or slightly n-type. That is, GaN layer 40 is not p-type, but is relatively pure, so that the number of holes or scattering points that would contribute to lower mobility within electron gas 60 may be minimized. In this embodiment, GaN layer 40 may have a thickness of about 0.1-1 um. Another AlGaN layer 50 that is nominally undoped is then epitaxially grown on GaN layer 40. As charge transfers from AlGaN layer 50 to GaN layer 40 because of the difference in bandgap between the materials, electron gas 60 comprised of a planar region of high-charge, high mobility electrons is formed in GaN layer 40 at the interface between AlGaN layer 50 and GaN layer 40.

As may be understood in view of FIG. 1, the structure may be characterized as a double heterojunction device, including a first heterojunction between GaN layer 40 and AlGaN layer 50 having electron gas 60 therebetween, and a second heterojunction between GaN layer 40 and AlGaN layer 30. The amount of charge that transfers across the first heterojunction from AlGaN layer 50 to GaN layer 40 to form electron gas 60 depends on the thickness and dopant concentration of AlGaN layer 50, which initially determines the amount of electrons in electron gas 60. In this embodiment, AlGaN layer 50 has a thickness within a range of about 0.01-0.04 μm. AlGaN layer 50 may however be doped n-type, whereby the n-type dopant can be incorporated uniformly within AlGaN layer 50, or in part of the layer only. The n-type dopant impurity in AlGaN layer 50 may be silicon.

The second heterojunction between AlGaN layer 30 and GaN layer 40 is used to compensate or neutralize electrons within electron gas 60. More particularly, AlGaN layer 30 is provided as a dopant compensation source that injects holes or positive charge into GaN layer 40, to improve the mobility of the device. For example, AlGaN layer 30 may have a thickness within a range of about 0.05-0.5 um, a dopant such as carbon (C) or magnesium (Mg), and a dopant concentration within a range of about $10^{16}$-$10^{18}$ cm$^{-3}$. Although GaN layer 40 is nominally undoped and relatively pure as noted above, residual n-type doping resulting from native defects within the material, or unintentional n-type impurities such as oxygen or silicon atoms, create trap states within GaN layer 40. These trap states disperse or scatter electrons within electron gas 60, resulting in reduced channel charge and current slump during device operation. Small amounts of p-type doping within AlGaN layer 30 are transferred as positive charge to GaN layer 40 so as to neutralize or balance residual n-type doping within GaN layer 40. The positive charge transferred to GaN layer 40 recombines with and depletes the n-type trap states, thus reducing scattering and dispersive behavior, to thus improve mobility of the normally-ON device.

Incidentally, the device of FIG. 1 is completed by formation of source and drain electrodes 74 and 76 on AlGaN layer 50, with gate electrode 72 on AlGaN layer 50 between source and drain electrodes 74 and 76. Electrodes 72, 74 and 76 may be formed either separately or simultaneously using standard deposition and photolithographic processing, and would typically be either titanium, aluminum, nickel or gold, or alloys thereof. Plural devices such as shown in FIG. 1 may be formed on the substrate, which may then be diced into individual devices.

In a further aspect of the first embodiment as described with respect to FIG. 1, in addition to depleting unwanted n-type trap states to increase mobility within electron gas 60, the thickness and dopant concentration of AlGaN layer 30 may be tailored to increase resistivity within GaN layer 40. That is, transfer of positive charge or holes from AlGaN layer 30 can neutralize electron gas 60 in part, by recombining with electrons within electron gas 60 to partially deplete electron gas 60. For instance, AlGaN layer 30 may be provided as having a dopant concentration and thickness, to thus partially deplete electron gas 60. As a result, the threshold of the normally-ON device may be adjusted so that device may be turned off responsive to a significantly lower voltage as applied to the corresponding control gate.

In connection with a still further aspect of the first embodiment, it is known that high electron mobility devices typically require semi-insulating substrates having relatively high resistivity in a range of greater than or about $10^7$ Ω-cm. Higher resistivity substrates in a range greater than or equal to about $10^9$ Ω-cm are preferred. Silicon carbide (SiC) substrates can be made to have moderate resistivity in the range of about $10^5$ to $10^7$ Ω-cm. According to this aspect of the first embodiment, substrate 10 can be provided as silicon carbide, and the thickness and dopant profile of AlGaN layer 30 may be tailored to deplete unintended residual negative charge in the silicon carbide moderate semi-insulating substrate 10, to thus increase resistivity of silicon carbide substrate 10 to be above $10^5$ Ω-cm. The dopant concentration within AlGaN layer 30 may be graded in a vertical direction to have a higher concentration of p-type impurities near the interface with buffer layer 20 and a lower concentration near the interface with GaN layer 40. This profile may be obtained by grading the p-type impurity profile during growth either by varying dopant flow, growth temperature, growth pressure, V/III gas ratios, or aluminum mole fraction (x) of $Al_xGa_{(1-x)}N$ layer 30.

For example, AlGaN layer 30 in FIG. 1 may have a dopant concentration of about $10^{16}$ cm$^{-3}$ at the interface with GaN layer 40, whereby the dopant concentration gradually increases to about $10^{18}$ cm$^{-3}$ at the interface with buffer layer 20. This aspect of depleting unintended residual negative charge is also applicable for use with zinc oxide (ZnO), aluminum nitride (AlN), boron nitride (BN) and diamond substrates.

Figure 2:
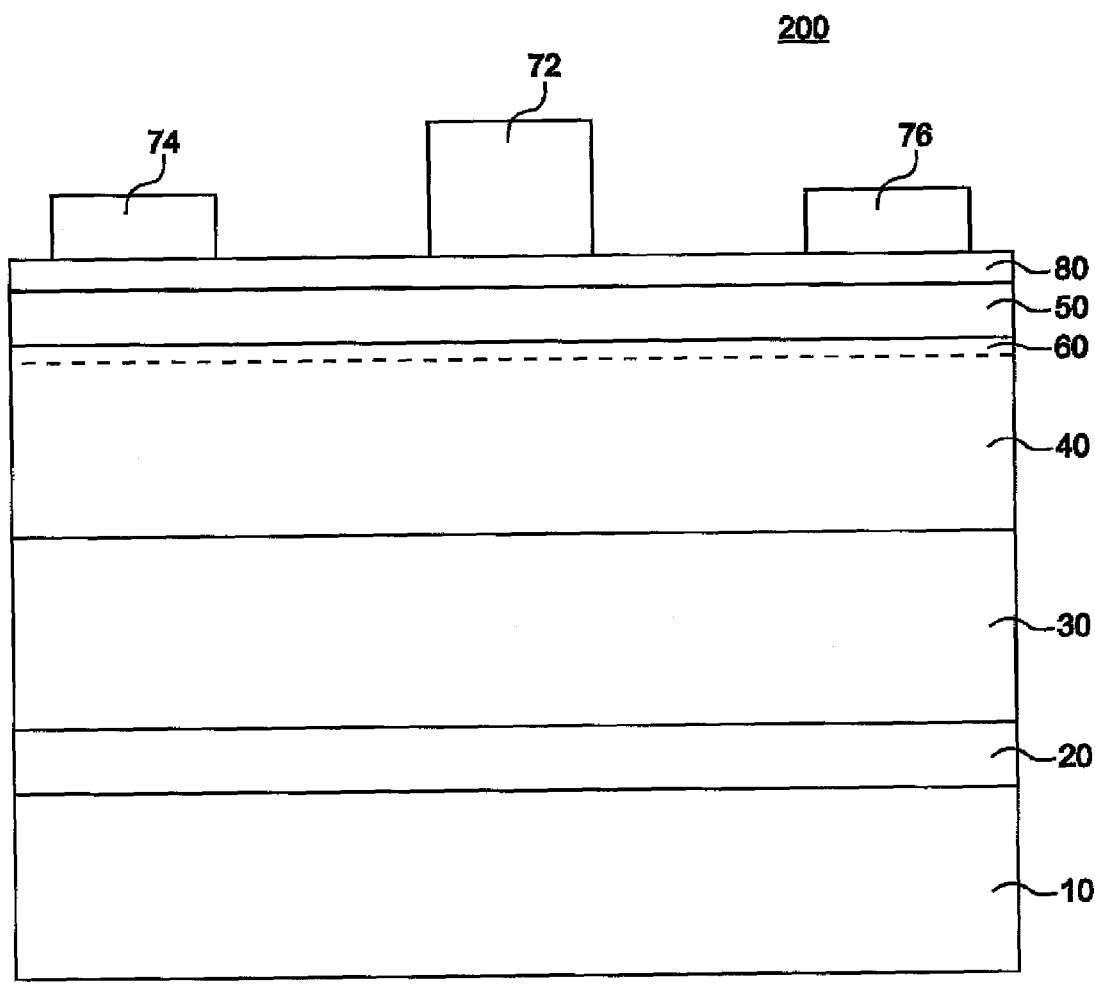
FIG. 2 illustrates a cross-section of a normally-ON depletion-mode high electron mobility device of a second embodiment including a capping layer.

In a second embodiment as illustrated in FIG. 2, a normally-ON high-electron mobility device 200 is shown which is substantially the same as high-electron mobility device 100 in FIG. 1, and thus includes similar reference numerals. High electron mobility device 200 of FIG. 2 additionally includes GaN capping layer 80 on AlGaN layer 50. GaN capping layer 80 may have a thickness of about 10-50 Å. Gate electrode 72, source electrode 74 and drain electrode 76 are disposed on GaN capping layer 80. GaN capping layer 80 prevents oxidation of AlGaN layer 50. Also, GaN capping layer 80 helps to control charge transfer. For instance, as negative charge transfers from AlGaN layer 50 to GaN layer 40 to form electron gas 60 in GaN layer 40 at the interface therebetween, positive charge consequently develops at the surface of AlGaN layer 50. With the provision of GaN capping layer 80 on AlGaN layer 50, the positive charge that develops at the surface of AlGaN layer 50 is no longer at the upper surface of the device. The use of GaN capping layer 80 thus leads to a more stable device that does not have positive charge accumulated at the upper surface thereof.

Figure 3:
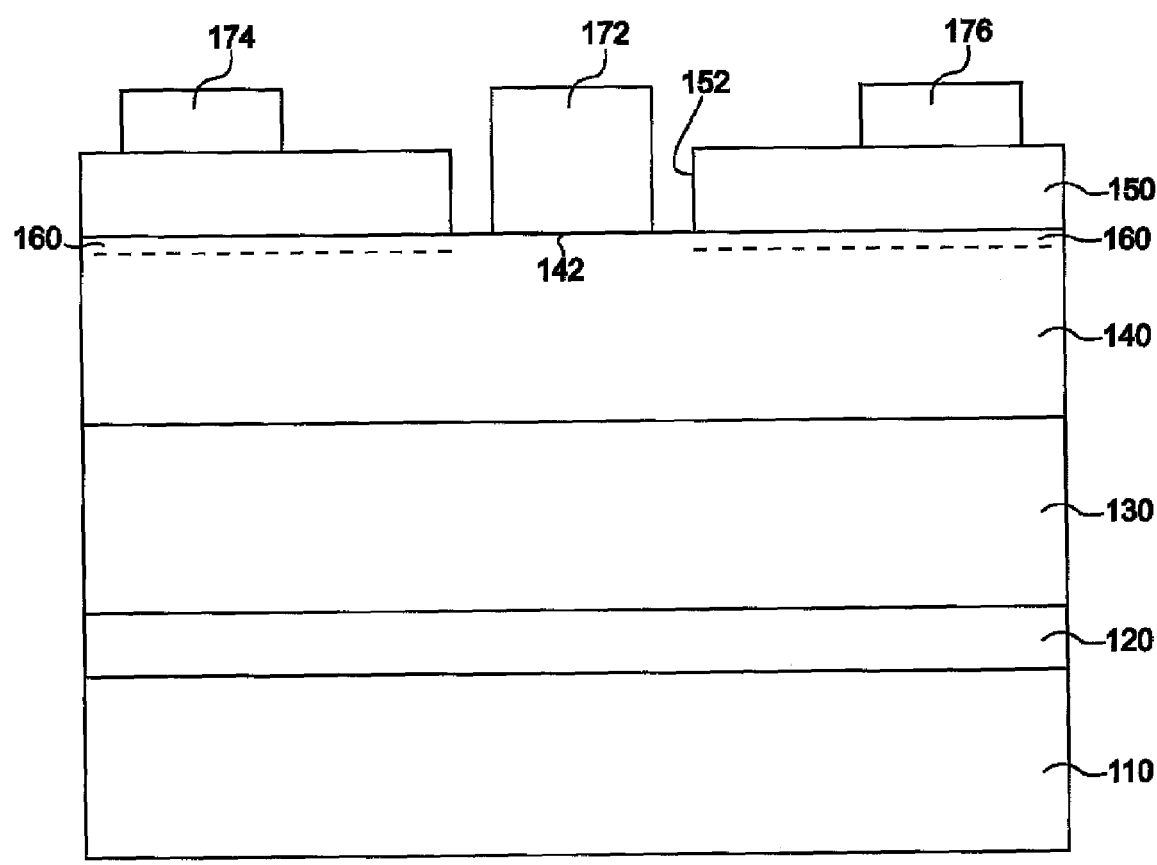
FIG. 3 illustrates a cross-section of a normally-OFF enhancement-mode high electron mobility device of a third embodiment.

FIG. 3 illustrates a normally-OFF enhancement-mode high electron mobility device 300 of a third embodiment. In this embodiment, high electron mobility device 300 includes substrate 110 and buffer layer 120 that may collectively be considered a device substrate. Device 300 further includes p-type AlGaN layer 130 and nominally undoped GaN layer 140 epitaxially grown on buffer layer 120, as part of device layers of the structure. Substrate 110, buffer layer 120, AlGaN layer 130 and GaN layer 140 of high electron mobility device 300 in FIG. 3 are substantially the same as substrate 10, buffer layer 20, AlGaN layer 30 and GaN layer 40 of high electron mobility device 100 in FIG. 1, and detailed description thereof is thus omitted for the sake of brevity.

As illustrated in FIG. 3, AlGaN layer 150 is formed on GaN layer 140 as having an opening 152 formed therethrough to the upper surface of GaN layer 140. AlGaN layer 150 is epitaxially grown on GaN layer 140, and opening 152 is formed within AlGaN layer 150 using standard photolithographic processing. For example, a photoresist layer (not shown) may be formed in a desired pattern on an epitaxially grown AlGaN layer, and the epitaxially grown AlGaN layer is subsequently etched with a chlorine or bromine based etchant for example, using the photoresist layer as a mask to provide AlGaN layer 150. The photoresist layer is subsequently removed. AlGaN layer 150 is thus provided as having opening 152 therethrough, which may have a diameter of typically less than 2 um, for example.

Subsequent formation of opening 152 in AlGaN layer 150, gate electrode 172 is formed on GaN layer 140 at area 142 within opening 152. Respective source and drain electrodes 174 and 176 are formed on AlGaN layer 150, with opening 152 therebetween. Electrodes 172, 174 and 176 are formed using standard deposition and photolithographic techniques, either separately or simultaneously.

Due to the differences in bandgap between AlGaN layer 150 and GaN layer 140, negative charge transfers across the heterojunction from AlGaN layer 150 to GaN layer 140, to form electron gas 160 within GaN layer 140 at the heterojunction, under AlGaN layer 150. However, because AlGaN layer 150 is formed as having opening 152 therethrough, a heterojunction is not formed at the surface of GaN layer 140 at area 142. Accordingly, negative charge is not transferred to area 142 near the surface of GaN layer 140 under opening 152. In other words, since AlGaN layer 150 is not provided as a source of negative charge at opening 152, an electron gas is not formed under opening 152 at area 142 of GaN layer 140. Electron gas 160 is thus discontinuous at area 142.

Thus, an enhancement-mode high electron mobility device 300 that is normally-OFF in an unbiased state is provided. As noted above, electron gas 160 is depleted of negative charge and is discontinuous at area 142 under opening 152 in an unbiased state. Upon application of a negative potential to gate electrode 172, negative charge is injected from gate electrode 172 into area 142 of GaN layer 140, and the corresponding electrons accumulate at the surface of GaN layer 140 to form a channel in area 142 bridging the discontinuous portions of electron gas 160.

In this embodiment, a second heterojunction between AlGaN layer 130 and GaN layer 140 injects positive charge into GaN layer 140 in a similar manner as described with respect to FIG. 1. The dopant concentration and thickness of AlGaN layer 130 may be tailored to further deplete area 142, to thus provide appropriate charge balance and ensure operation of the device in an enhancement-mode.

As noted above, enhancement mode high electron mobility device 300 in FIG. 3 includes opening 152 that extends entirely through AlGaN layer 150 to the surface of GaN layer 140, so that electron gas 160 is depleted at area 142. However, an enhancement-mode device may be realized without the necessity of an opening that extends entirely through to GaN layer 140, as will be described with reference to FIG. 4.

Figure 4:
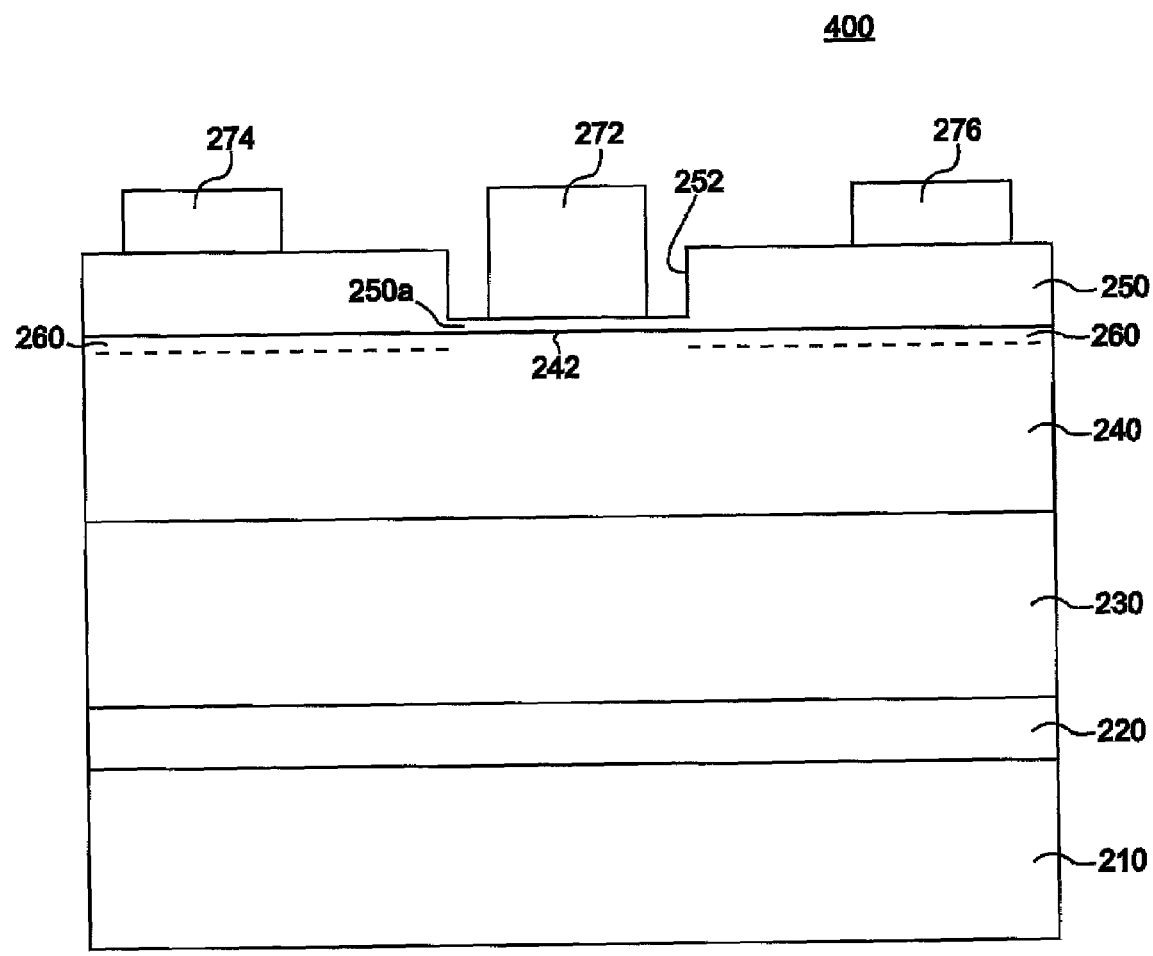
FIG. 4 illustrates a cross-section of a normally-OFF enhancement-mode high electron mobility device of a fourth embodiment.

FIG. 4 illustrates a normally-OFF enhancement-mode high electron mobility device 400 that is somewhat similar as high electron mobility device 300 described with respect to FIG. 3. High electron mobility device 400 in FIG. 4 includes substrate 210, buffer layer 220, AlGaN layer 230, GaN layer 240, electron gas 260 and electrodes 272, 274 and 276, that are substantially the same as the corresponding layers of device 300 described with respect to FIG. 3. Since these corresponding layers are substantially the same, detailed description thereof will be here omitted for the sake of brevity.

In high electron mobility device 400 of FIG. 4, opening 252 does not extend completely through AlGaN layer 250 and thus does not expose the surface of GaN layer 240. That is, AlGaN layer 250 includes a thin portion 250a at the bottom of opening 252, and gate electrode 272 is formed on AlGaN layer portion 250a. Opening 252 within AlGaN layer 250 may be formed using standard photolithographic processing in a somewhat similar manner as described with respect to FIG. 3, whereby etching of an epitaxially grown AlGaN layer is merely stopped short of the surface of GaN layer 240, so that AlGaN layer 250 may be provided as having opening 252 with AlGaN layer portion 250a at the bottom thereof. For example, AlGaN layer 250 at areas peripheral of opening 252 may have a thickness of about 0.01-0.04 um, while AlGaN layer portion 250a at the bottom of opening 252 may have a thickness of about 0.001-0.01 um.

Enhancement-mode high electron mobility device 400 in FIG. 4 operates in a similar manner as device 300 described with respect to FIG. 3. However, AlGaN layer 250 at areas peripheral of opening 252 are relatively thicker than AlGaN layer portion 250a, and thus significantly more electrons or negative charge is transferred from AlGaN layer 250 than from AlGaN layer portion 250a. The thickness of AlGaN layer portion 250a, the dopant concentration of AlGaN layer 250 including AlGaN layer portion 250a, and the thickness and dopant concentration of AlGaN layer 230 that injects holes or positive charge into GaN layer 240 via the second heterojunction between GaN layer 240 and AlGaN layer 230, are all tailored to ensure that area 242 under AlGaN layer portion 250a is fully depleted of negative charge when the device is in an unbiased state without potential applied to gate electrode 272. The various parameters are selected to provide appropriate charge balance and optimum channel performance in enhancement mode device 400.

Figure 5:
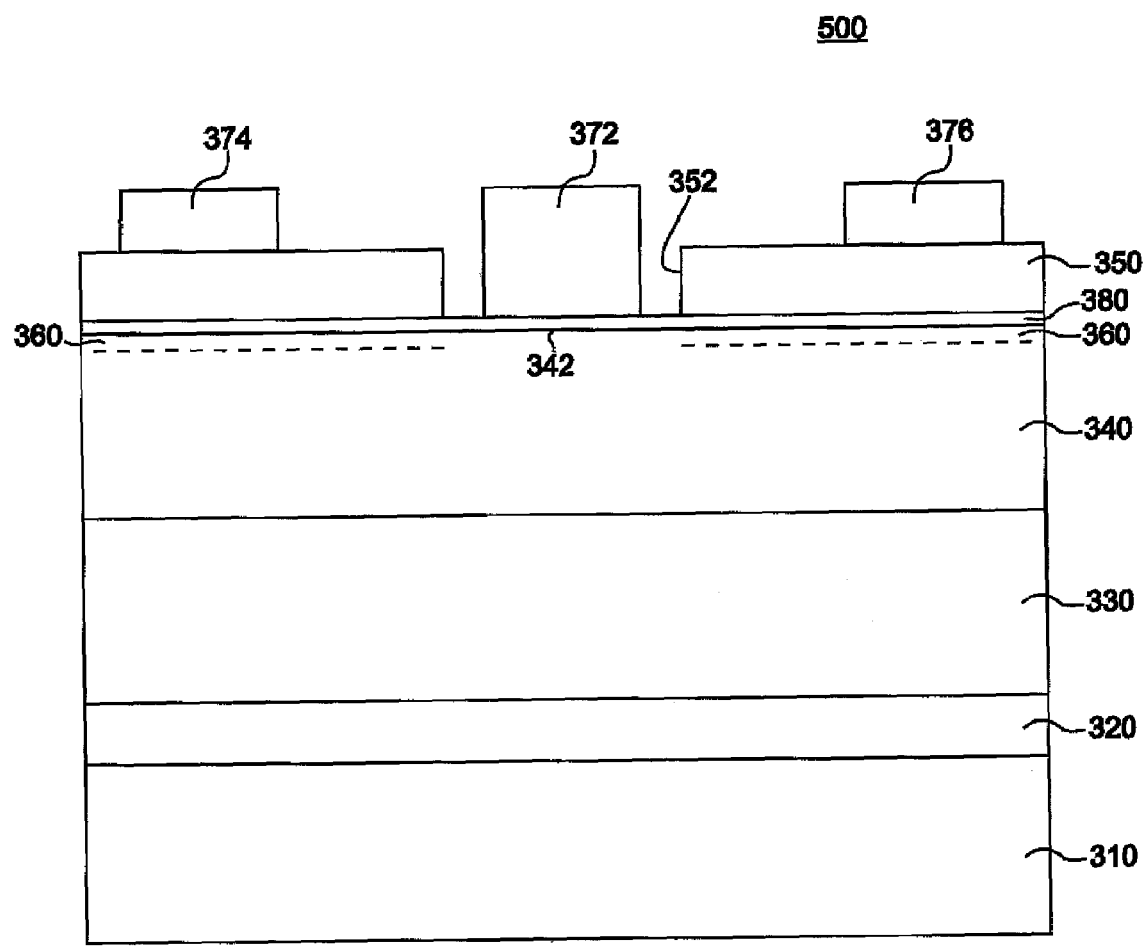
FIG. 5 illustrates a cross-section of a normally-OFF enhancement-mode high electron mobility device of a fifth embodiment including an etch stop layer.

FIG. 5 illustrates a normally-OFF enhancement-mode high electron mobility device 500 that is somewhat similar as high electron mobility device 300 described with respect to FIG. 3. High electron mobility device 500 in FIG. 5 includes substrate 310, buffer layer 320, AlGaN layer 330, GaN layer 340, electron gas 360, AlGaN layer 350 and electrodes 372, 374 and 376, that are substantially the same as the corresponding layers of device 300 described with respect to FIG. 3. Since these corresponding layers are substantially the same, detailed description thereof will be here omitted for the sake of brevity.

An additional feature of high electron mobility device 500 in FIG. 5 is etch stop layer 380, which may be an aluminum nitride (AlN) layer. Etch stop layer 380 is epitaxially grown on GaN layer 340, and an AlGaN layer is subsequently epitaxially grown on etch stop layer 380. Thereafter, a photoresist layer (not shown) is formed in a desired pattern on the epitaxially grown AlGaN layer, and the epitaxially grown AlGaN layer is subsequently etched down to etch stop layer 380 to provide AlGaN layer 350 as including opening 352. Accordingly, an opening 352 can be provided through AlGaN layer 350 without exposing the underlying surface of GaN layer 340. Subsequently, gate electrode 372 is formed on etch stop layer 380 within opening 352. Respective source and drain electrodes 374 and 376 are formed on AlGaN layer 350, with opening 352 therebetween. Electrodes 372, 374 and 376 are formed using standard deposition and photolithographic techniques, either separately or simultaneously.

As described, high electron mobility device 500 of FIG. 5 includes etch stop layer 380 at the bottom of opening 352, and AlGaN layer 350 is removed at opening 352. Since a heterojunction is not formed at the surface of GaN layer 340 at area 342, in an unbiased state negative charge is not transferred into area 342 of GaN layer 340 under opening 352. However, since a heterojunction is provided at the periphery of opening 352 between AlGaN layer 350 and GaN layer 340, negative charge is transferred from AlGaN layer 350 to GaN layer 340, to form discontinuous electron gas 360 in GaN layer 340 at the heterojunction. As described previously, AlGaN layer 350 is nominally undoped, and at the periphery of opening 352 AlGaN layer 350 may have a thickness of about 0.001-0.01 um for example. Upon application of a negative potential to gate electrode 372, electrons are injected into GaN layer 340, to form a channel in area 342 bridging the discontinuous portions of electron gas 360, to turn on the normally-OFF device.

As noted above, etch stop layer 380 may be an aluminum nitride layer. In a variation of high electron mobility device 500 of FIG. 5, etch stop layer 380 may be $Al_yGa_{(1-y)}N$, while layer 350 is $Al_xGa_{(1-x)}N$, wherein y is relatively high in value so that y>x. The underlying $Al_yGa_{(1-y)}N$ etch layer would slow down the etch rate as compared to the $Al_xGa_{(1-x)}N$ layer 350, and the use of such an AlGaN etch stop layer would simplify processing steps necessary to manufacture the structure as compared to a device using an etch stop layer of a different material. Also, etch stop layer 380 would help to reduce alloy scattering.

As described previously, the device layers including AlGaN layer 30, GaN layer 40 and AlGaN layer 50 of FIG. 1 are epitaxially grown on buffer layer 20 in a continuous or same process using metal organic vapor deposition (MOCVD), for example. A still further feature relates to the manner in which p-type AlGaN layer 30 is epitaxially grown.

High energy crystals such as GaN are large bandgap materials, and consequently the incorporation of impurities therein is difficult. The incorporation of p-type impurities into GaN is particularly difficult. In order to alleviate this problem and to enhance p-type doping so as to more easily grow p-type AlGaN layer 30, modest amounts of aluminum are introduced into a preliminary GaN layer during epitaxial growth in this embodiment, and carbon (C) is used as a p-type dopant. The aluminum atoms getter carbon atoms, whereby aluminum and carbon atoms resultingly achieve significant atomic bonding. The aluminum helps the amphoteric carbon atoms sit on the substitutional nitrogen sites ($C_N$), resulting in improved p-type behavior. As a preliminary GaN layer is epitaxially grown, carbon and aluminum are added in the MOCVD process. The incorporation of aluminum should be at low levels not to exceed an aluminum mole fraction of about 0.15% (i.e. x<0.0015) for example, so that the impact on or increase of the bandgap of the layer during epitaxial growth is negligible or at least of no consequence for device operation, while the impact in terms of doping is substantial. For example, 0.1% incorporation of aluminum into the preliminary GaN layer has very small or insignificant impact with respect to bandgap change, but has significant impact on doping levels. In a sense, the GaN preliminary layer may be considered as "co-doped" with aluminum in order to increase incorporation of carbon, although in a strict sense aluminum is not a dopant but may more precisely be characterized as an isoelectric center.

As a still further aspect of the first embodiment, the dopant profile of a buffer layer can be tailored to increase the resistivity of a near-surface region of the underlying substrate. Typically, buffer layers are grown as a preliminary layer on a substrate, and are grown out so that defect concentration within the buffer layer may be decreased prior to forming active device layers thereon. In this further embodiment, the buffer layer takes an additional role. That is, the dopant concentration of the buffer layer is selected based on the initial resistivity and the conductivity type of the substrate, to deplete unintended residual charge within the near-surface region of the substrate, and to consequently increase resistivity of the near surface region of the substrate to a target resistivity. The near-surface region of a substrate should be understood to be a region from the surface of the substrate to a depth of about 10 μm.

For example, in the case of a substrate of n-type conductivity, if excess negative charge within the near surface region of the substrate is depleted so that fewer charge carriers are available, the resistivity of the near surface region of the substrate will increase. In accordance with this embodiment, for a substrate having resistivity in the range of about $10^3$ ohms/cm or thereabout for example, the near-surface region may be depleted of excess charge to consequently increase the resistivity thereof into the medium resistivity range of $10^3$-$10^7$ ohms/cm for example, or still further into the high resistivity range of $10^3$-$10^9$ ohms/cm for example. High electron mobility devices with reduced leakage current and improved performance can thus be made more cost effectively using substrates of lower initial or characteristic resistivity, resulting in higher device yields.

This additional embodiment will now be described with reference to FIG. 6, which illustrates a general structure including GaN buffer layer 420 as formed on substrate 410, with active device layer 490 formed on buffer layer 420. In this example, the structure is a high electron mobility device, and substrate 410 is silicon-carbide, and buffer layer 420 and active device layer 490 are epitaxially grown. Active device layer 490 may be a GaN layer, an AlGaN layer, or other suitable layer, and may be doped or non-doped. It should be understood however that this embodiment should not necessarily be limited to high electron mobility devices, but may also be applied to devices such as MESFETs, MISFETs, MOSFETs, BJTs and LEDs for example, or may be applied to the manufacture of custom substrates of desired target resistivity. It should also be understood that this embodiment should not be limited merely to silicon-carbide substrates, but may also be applicable for use with silicon, sapphire or any other suitable type of substrate material. Also, other buffer layer materials such as AlGaN may be used.

In this embodiment, the initial or characteristic resistivity of the substrates to be used are first measured using conventional techniques and equipment, and the substrates are subsequently binned by resistivity into lots identified as $10^3$ ohms/cm, $10^4$ ohms/cm, ..., $10^8$ ohms/cm, and $10^9$ ohms/cm, for example. Thereafter, GaN layers are epitaxially grown in test runs on a number of the substrates from each of the respectively different binned lots, with carbon incorporated therein as a p-type dopant. Processing conditions such as pressure, temperature and dopant concentration are controlled and varied during the test runs of the different respective binned lots. For example, processing conditions to control carbon incorporation during epitaxial growth of GaN layers may vary within ranges of 980-1050° C., 50-100 Torr, and V/III ratio 2500-3500.

As charge transfers from the grown GaN layers into the substrates, the amount of depletion within the near-surface regions of the substrates, and consequently the resultant resistivity thereof, will depend upon the charge available for transfer, or primarily upon the p-type dopant concentration of the GaN layers during epitaxial growth. The resistivity of the near-surface regions of the substrates will thus change as the GaN layers are grown thereon. The resistivity of the near-surface regions of the substrates are subsequently measured after epitaxial growth of the GaN layers, and a data base is developed using the collected data. The data base thus indicates the processing conditions including pressure, temperature and dopant concentration necessary to epitaxially grow a GaN layer that would sufficiently deplete residual charge within a near-surface region of a substrate of any given initial or characteristic resistivity to the extent necessary to provide a compensated substrate with a near-surface region having any particular desired resultant target resistivity.

For example, the data base would indicate the processing conditions including pressure, temperature and dopant concentration necessary to epitaxially grow an appropriate GaN layer that would sufficiently deplete residual charge within a substrate having $10^4$ ohms/cm initial resistivity, so that a near-surface region of the substrate may have a resultant target resistivity of $10^9$ ohms/cm. That is, the data base would indicate the epitaxial growth processing parameters necessary to provide a GaN layer that would transform the resistivity of a near-surface region of a substrate into any desired resultant target resistivity.

It should be understood that such a data base could be developed by process technicians, and may be stored and/or presented in a variety of ways and formats. Also, the content of such a data base would be unique dependent upon the material of the substrate, the layer epitaxially grown thereon, and the corresponding equipment. A number of different data bases may be developed and prestored for various different substrate and buffer layer materials, and various different processing equipment. The various data bases may be stored within a library and referenced during manufacture of various different HEMT devices.

In addition to the preliminary resistivity determination and binning of the substrates, conductivity type of the substrates is determined and also stored within the data base. Conductivity type of the substrates are conventionally determined by resistivity measurements such as IV, Hall, RC time constant measurements, which would include 4-point probe, Van-der-Pauw or contactless measurements for example.

Silicon carbide substrates typically have n-type conductivity, because nitrogen is used as a source gas during manufacture of the silicon carbide substrate. As nitrogen within the substrate increases, residual n-type charge increases within the substrate, and the substrate becomes more n-type conductive. Consequently, resistivity of the substrate decreases, and leakage current becomes problematic.

In this case, based on initial or characteristic resistivity and conductivity type of the substrate, the data base is used to determine the processing conditions including pressure, temperature and dopant concentration needed to epitaxially grow on the substrate a GaN buffer layer that would provide the p-type charge necessary to transfer into and deplete the residual n-type charge within a near-surface region of the substrate. As the near-surface region of the substrate is depleted of residual n-type charge during epitaxial growth of the GaN buffer layer, resistivity of the near-surface region of the substrate increases.

In contrast to having excess residual n-type charge, silicon carbide substrates may be undercompensated during manufacture to thus have excess p-type charge. During manufacture of silicon carbide substrates, a certain level of boron is driven into the substrate by the source materials used. Boron is a p-type dopant. In an effort to compensate for p-type incorporation into the silicon-carbide substrate, nitrogen is used as a compensating n-type dopant. However, if n-type doping is insufficient, the undercompensated silicon carbide substrate has excess p-type charge, and thus is p-type conductive because of the existence of excess holes.

In this case, based on initial or characteristic resistivity and conductivity type of the substrate, the data base is used to determine the processing conditions including pressure, temperature and dopant concentration needed to epitaxially grow on the substrate a GaN buffer layer that is rich in n-type, and that would provide the n-type charge necessary to transfer into and deplete excess p-type charge within a near-surface region of the substrate. It should be understood that GaN is inherently n-type because of oxygen and silicon that is incorporated therein during processing. Therefore, in contrast to the case of a substrate with residual n-type charge as described previously, the GaN buffer layer is epitaxially grown so as to have little or no p-type carbon incorporated therein, or the least amount as possible, so that the GaN layer may be maintained as n-type.

Figure 6:
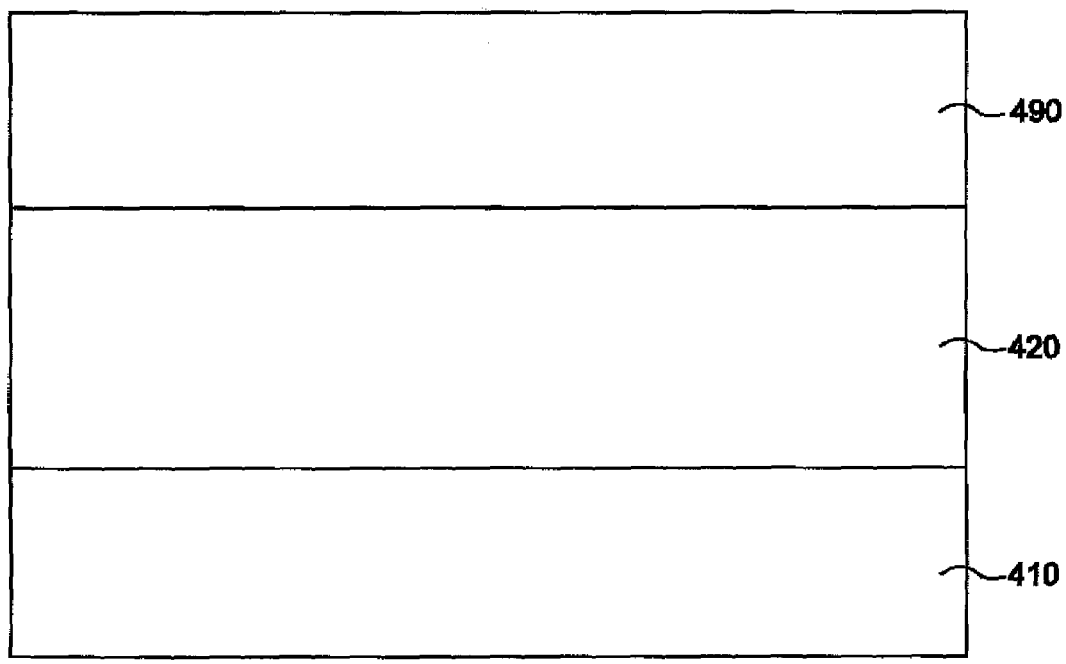
FIG. 6 illustrates a cross-section of a high electron mobility device having a compensating buffer layer of a further embodiment.

Accordingly, in accordance with this embodiment, in the case where silicon-carbide substrate 410 has residual n-type charge, GaN buffer layer 420 as shown in FIG. 6 is epitaxially grown as having a p-type dopant such as carbon incorporated therein, to deplete the n-type charge within the near-surface region of substrate 410.

In contrast, in the case where silicon-carbide substrate 410 has excess p-type charge due to undercompensation for instance, GaN buffer layer 420 as shown in FIG. 6 is epitaxially grown rich in n-type with little or no carbon incorporated therein, so as to deplete excess p-type charge in the near-surface region of substrate 410. The desired active device layer 490 may be subsequently epitaxially grown on buffer layer 420 in either case. Alternatively, substrate 410 with buffer layer 420 epitaxially grown thereon may be provided without active device layer 490 thereon, as a custom built substrate with resultant target resistivity as desired.

In a variation of this embodiment as will now be described also with respect to FIG. 6, buffer layer 420 in both the above noted cases may be epitaxially grown to have a p-type dopant concentration that progressively increases or decreases along a growth direction away from substrate 410, depending upon the conductivity type of substrate 410. Ideally, high electron mobility devices should be grown on highly resistive buffer layers, to prevent leakage current and to minimize charge coupling between the substrate and the device. In accordance with this embodiment, the GaN buffer layer is epitaxially grown as having a graded dopant profile, or as having sub-layers of different dopant concentration, so that regardless of the dopant concentration of the buffer layer as initially selected to deplete the n-type or p-type charge within the substrate, the buffer layer is epitaxially grown out to eventually be highly resistive.

As an example, for the case in which substrate 410 in FIG. 6 is n-type silicon-carbide and has an initial or characteristic resistivity of $10^5$ ohms/cm, the data base is used to determine the processing conditions including pressure, temperature and dopant concentration needed to epitaxially grow on the substrate a GaN buffer layer that would provide the p-charge necessary to deplete most of the residual n-type charge within the near-surface region of the substrate. As epitaxial growth of the GaN buffer layer proceeds, the processing conditions are changed so that carbon p-type incorporation in GaN buffer layer 20 decreases. For example, after the initial processing conditions are selected from the data base and epitaxial growth has proceeded for a certain time, temperature and/or pressure may be subsequently changed so that carbon p-type incorporation in GaN buffer layer 20 decreases. That is, the general trends in the data base would be used to guide the direction of changes needed for varying the process parameters to decrease carbon p-type incorporation.

It should be understood that at areas within the GaN buffer layer 420 progressively further away from the interface between substrate 410 and GaN buffer layer 420 shown in FIG. 6, lesser respective amounts of p-type dopant are needed to contribute to depletion of residual n-type charge within the near-surface region of substrate 410. Most of the depletion of residual n-type charge within the near-surface region of substrate 410 occurs because of charge transferred from GaN buffer layer 420 grown using the initially determined processing conditions. To further compensate the near-surface region of substrate 410, progressively smaller amounts of p-type charge are necessary to be transferred from GaN buffer layer 420 that is expitaxially grown after the initial processing conditions are changed. The dopant concentration of p-type incorporated into GaN buffer layer 420 at the interface with active device layer 490 should be just enough to ensure that n-type charges within GaN buffer layer 420 near the interface with active device layer 490 are depleted, so that resistivity at the interface with active device layer 490 is high.

Accordingly, GaN buffer layer 420 may be epitaxially grown on an n-type substrate 410 as having a graded dopant profile so as to be doped more p-type at substrate 410, and progressively doped less p-type and thus more resistive along the growth direction toward active device layer 490. In this embodiment, GaN buffer layer is thus epitaxially grown to be smoothly graded. As noted above, in this case GaN buffer layer 420 has a graded dopant profile that achieves a two-fold purpose: (1) to compensate residual charge in substrate 410, and to thus increase resistivity of the near-surface region of substrate 410, and (2) to provide a highly resistive upper portion of GaN buffer layer 420 that is ideal for device growth.

For the case in which substrate 410 in FIG. 6 is p-type silicon carbide, based on initial or characteristic resistivity of substrate 410, the data base is used to determine the processing conditions including pressure, temperature and dopant concentration needed to epitaxially grow on the substrate a GaN buffer layer that is rich in n-type charge with little or no p-type carbon incorporation therein, that would provide the n-type charge necessary to transfer into and deplete most of the excess p-type charge within substrate 410. As epitaxial growth of the GaN proceeds, p-type carbon incorporation should gradually increase so that the GaN buffer layer becomes less n-type. This is so because in order to deplete excess p-type charge within the near-surface region of substrate 410, not as much n-type charge is necessary to be transferred to substrate 410 from the later grown portions of the GaN buffer layer. The p-type incorporation should gradually increase toward the interface with active device layer 490 so as to deplete residual n-type charge within GaN buffer layer 420, and to make GaN buffer layer 420 highly resistive near the interface with active device layer 490. Thus, the two-fold goal of compensating residual charge within the near-surface region of the p-type substrate, and providing a highly resistive upper portion of GaN buffer layer 490 ideal for device growth, can be realized.

Figure 7:
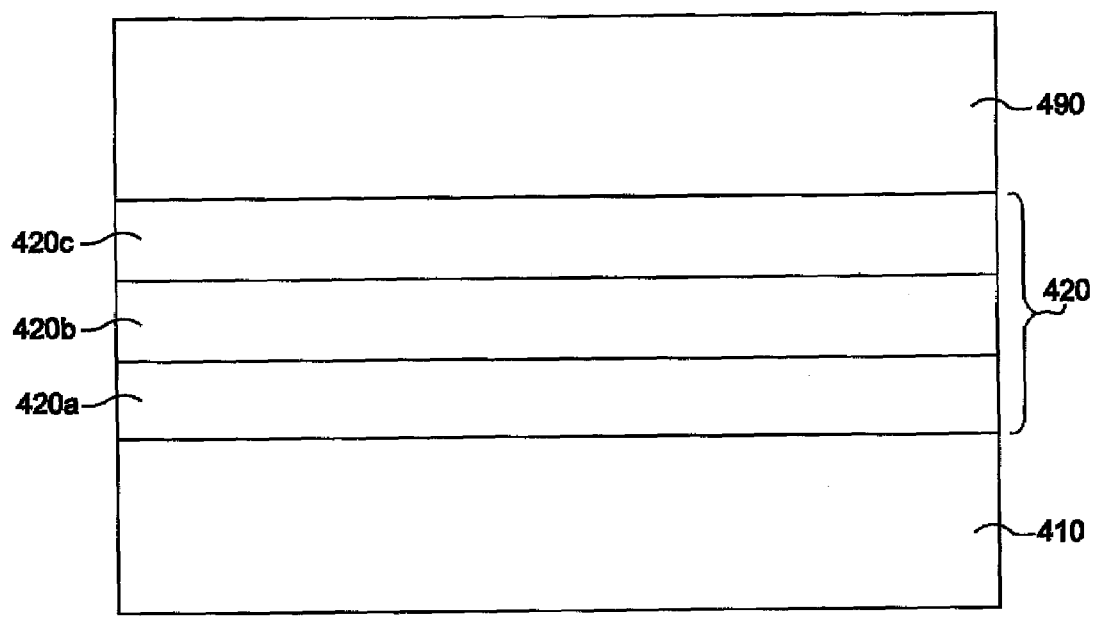
FIG. 7 illustrates a cross-section of a high electron mobility device having a compensating buffer layer consisting of sub-layers, of a still further embodiment.

FIG. 7 illustrates how GaN buffer layer 420 may be provided as having sub-layers of different dopant concentrations to likewise achieve the goal of both compensating residual charge within the near-surface region of substrate 410 to increase resistivity thereof, and to provide a highly resistive upper portion of GaN buffer layer 420 ideal for device growth. As shown, GaN buffer layer 420 is epitaxially grown as having three buffer sub-layers 420a, 420b and 420c. Buffer layer 420a is epitaxially grown on substrate 410, buffer sub-layer 420b is epitaxially grown on buffer sub-layer 420a, and buffer sub-layer 420c is epitaxially grown on buffer sub-layer 420b. Based on initial or characteristic resistivity and conductivity type of substrate 410, the data base is used to determine the processing conditions including pressure, temperature and dopant concentration necessary to epitaxially grow each of the buffer sub-layers 420a, 420b and 420c to meet the two-fold goal noted above.

For the case in which substrate 410 in FIG. 7 is n-type silicon carbide, the data base is used to determine the processing conditions needed to epitaxially grow buffer sub-layer 420a on substrate 410, so as to provide necessary p-type carbon incorporation to deplete most of the residual n-type charge within the near-surface region of substrate 410. Processing conditions needed to epitaxially grow buffer sub-layer 420b on buffer sub-layer 420a are then determined, so as to provide comparatively less p-type carbon incorporation, since a lesser amount of p-type charge is needed from buffer sub-layer 420b to help deplete the near-surface region of substrate 410. Subsequently, processing conditions needed to epitaxially grow buffer sub-layer 420c on buffer sub-layer 420b are determined, to provide just enough p-type dopant incorporation to compensate for any residual n-type charge within buffer sub-layer 420c, so that buffer sub-layer 420c may be ideally highly resistive near the interface with active device layer 490.

For the case in which substrate 410 in FIG. 7 is p-type silicon carbide, the data base is used to determine the processing conditions needed to epitaxially grow buffer sublayer 420a on substrate 410, so as to provide buffer sub-layer 420a as having little or no carbon p-type incorporation, or in other words so as to provide buffer sub-layer 420a as rich in n-type. Processing conditions needed to epitaxially grow buffer sub-layer 420b on buffer sub-layer 420a are thereafter determined, so as to provide buffer sub-layer 420b as having comparatively greater p-type carbon incorporation, because a lesser amount of n-type charge would be necessary from buffer sub-layer 420b to help deplete the near-surface region of substrate 410. Subsequently, the processing conditions needed to epitaxially grow buffer sub-layer 420c on buffer sub-layer 420b are determined, to provide buffer sub-layer 420c as having slightly greater p-type concentration as would be needed to compensate for any residual n-type charge within buffer sub-layer 420c, so that sub-layer 420c may be ideally highly resistive for device growth. In the case of the embodiment of FIG. 7, distinct different sets of parameters could be selected to grow the different buffer sub-layers 420a, 420b and 420c.

Although the embodiments have been described in detail, the scope should not be limited by the corresponding description in the figures. For instance, any of AlGaN layer 30, GaN layer 40 and AlGaN layer 50 of device 200 in FIG. 1, or any of the corresponding layers in any one of FIGS. 2-5 may contain indium (In) or a corresponding element, to change the bandgap of the corresponding layer. For example, by introducing a small amount of indium into GaN layer 40 of FIG. 1, the bandgap of the layer can be reduced, which consequently increases the number of electrons transferred into the layer, to thus increase mobility.

As a further variation, in a similar manner as described with respect to FIG. 1, the thickness and dopant concentration of AlGaN layers 130, 230 and 330 in FIGS. 3-5 may be tailored to increase the resistivity within the respective GaN layers 140, 240 and 340. That is, the amount of positive charge or holes injected from the AlGaN layer into the GaN layer can be increased, to deplete the electron gas to a greater extent. As a result, the threshold of the normally-OFF devices may be adjusted so that the devices require a higher voltage as applied to the control gate to be turned on.

As a still further variation, various p-type dopants such as Mg, Be, Zn, Ca, Fe, Cd, Cr or the like may also be used in the p-type AlGaN layers, although aluminum would not necessarily getter these p-type dopants. Moreover, GaN capping layer 80 as described with respect to device 200 in FIG. 2 may be used as an uppermost capping layer in either of devices 300, 400 and 500 as respectively described with respect to FIGS. 3-5. Also, etch stop layer 380 as described with respect to device 500 in FIG. 5 may be used in either of devices 100 and 200 described with respect to FIGS. 1 and 2, as disposed between the top surface of the corresponding GaN layer and the upper AlGaN layer. Additionally, p-type AlGaN layers 30, 130, 230 and 330 of FIGS. 2-5 may have dopant profiles that are graded in the vertical direction, as described with respect to FIG. 1.

It should be further understood that the embodiments of FIGS. 6 and 7 are applicable to device structures having buffer layers of various thicknesses. For instance, buffer layer 420 of FIG. 6 may have a thickness in a range of about 1-5 um, or about 3 um. On the other hand, in some high frequency applications, it may be desired to dispose the device as far away from the substrate as possible. In this case, buffer layers having thickness of about 50-150 um may be desirable. The embodiments of FIGS. 6 and 7 would thus likewise be applicable for buffer layer thickness of about 50-150 um, wherein the thicknesses of the buffer sub-layers in FIG. 7 as taken together would be about 50-150 um. With respect to the embodiment of FIG. 7, it should be understood that buffer layer 420 may include any number of buffer sub-layers as desired, and that the buffer sub-layers should not be limited to three in number. Also, it should be understood that the concept of using Al as a getter to enhance carbon incorporation is also applicable to the embodiments of FIGS. 6 and 7. Also, it is contemplated that in a variation of the embodiments of FIGS. 6 and 7, the buffer layers may be epitaxially grown as having n-type dopant incorporation instead of p-type dopant incorporation. Also, the buffer layers 420 in FIGS. 6 and 7 may be grown by metal organic chemical vapor deposition (MOCVD), molecular beam epitaxy (MBE), halide vapor phase epitaxy (HVPE), or any general epitaxial growth method as would be understood by one of ordinary skill. These various changes and modifications of the preferred embodiments, and any others that would become apparent to those of ordinary skill, should be considered within the spirit and scope of the invention.

What is claimed is:

1. A method of compensating resistivity of a near-surface region of a substrate comprising:
   providing the substrate;
   measuring a resistivity of the substrate;
   determining a conductivity type of the substrate; and
   epitaxially growing a buffer layer on the substrate, the buffer layer being grown as having a dopant concentration selected responsive to the measured resistivity and the determined conductivity type of the substrate, to deplete residual charge within the near-surface region of the substrate,
   wherein the substrate has n-type conductivity, and the buffer layer is doped with a p-type dopant at the dopant concentration selected responsive to the measured resistivity and the n-type conductivity of the substrate, and
   wherein the buffer layer is doped with carbon, and aluminum is used to getter the carbon during said epitaxially growing the buffer layer.

2. The method of compensating resistivity of claim 1, wherein the buffer layer is epitaxially grown as having sub-layers of different respective dopant concentrations, and dopant concentration is greatest in a first sublayer nearest the substrate and is respectively lower in each succeeding sub-layer.

3. The method of compensating resistivity of claim 1, wherein the buffer layer is epitaxially grown as having a graded dopant profile, wherein dopant concentration is greatest at the substrate and progressively lower further away from the substrate.

4. The method of compensating resistivity of claim 1, wherein the substrate is silicon carbide.

5. The method of compensating resistivity of claim 4, wherein the buffer layer is gallium nitride.

6. A method of adaptively controlling resistivity of a near-surface region of a substrate comprising:
   determining a conductivity type and initial resistivity of the substrate;
   selecting a target resistivity for the substrate; and
   epitaxially growing a buffer layer on the substrate, wherein a dopant concentration of the buffer layer is selected responsive to the conductivity type and the initial resistivity of the substrate to deplete residual charge within the substrate, so that the initial resistivity of the near-surface region of the substrate is changed to be substantially the target resistivity,
   wherein the substrate has n-type conductivity, and the buffer layer is doped with a p-type dopant at the dopant concentration selected responsive to the initial resistivity and the n-type conductivity of the substrate, and wherein the buffer layer is doped with carbon, and aluminum is used to getter carbon during said epitaxially growing a buffer layer.

7. The method of adaptively controlling resistivity of claim 6, wherein the buffer layer is epitaxially grown as having sublayers of different respective dopant concentrations, wherein dopant concentration is greatest in a first sublayer nearest the substrate and is respectively lower in each succeeding sublayer.

8. The method of adaptively controlling resistivity of claim 6, wherein the buffer layer is epitaxially grown as having a graded dopant profile, wherein dopant concentration is greatest at the substrate and progressively lower further away from the substrate.

9. The method of adaptively controlling resistivity of claim 6, wherein the substrate is silicon carbide.

10. The method of adaptively controlling resistivity of claim 9, wherein the buffer layer is gallium nitride.

11. The method of adaptively controlling resistivity of claim 6, wherein the initial resistivity of the substrate is not less than $10^3$ ohms/cm.

12. A method of adaptively controlling resistivity of a near-surface region of a substrate comprising:
    determining a conductivity type and initial resistivity of the substrate;
    selecting a target resistivity for the substrate; and
    epitaxially growing a buffer layer on the substrate, wherein a dopant concentration of the buffer layer is selected responsive to the conductivity type and the initial resistivity of the substrate to deplete residual charge within the substrate, so that the initial resistivity of the near-surface region of the substrate is changed to be substantially the target resistivity.

13. The method of adaptively controlling resistivity of claim 12, wherein the substrate has n-type conductivity, and the buffer layer is doped with a p-type dopant at a dopant concentration selected responsive to the initial resistivity and the n-type conductivity of the substrate.

14. The method of adaptively controlling resistivity of claim 13, wherein the buffer layer is epitaxially grown as having sublayers of different respective dopant concentrations, wherein dopant concentration is greatest in a first sublayer nearest the substrate and is respectively lower in each succeeding sublayer.

15. The method of adaptively controlling resistivity of claim 13, wherein the buffer layer is epitaxially grown as having a graded dopant profile, wherein dopant concentration is greatest at the substrate and progressively lower further away from the substrate.

16. The method of adaptively controlling resistivity of claim 12, wherein the substrate has p-type conductivity, and the buffer layer is doped with a p-type dopant at a dopant concentration responsive to the resisitivity and the p-type conductivity of the substrate.

17. The method of adaptively controlling resistivity of claim 16, wherein the buffer layer is epitaxially grown as having sublayers of different respective dopant concentrations, wherein dopant concentration is lowest in a first sublayer nearest the substrate and is respectively greater in each succeeding sublayer.

18. The method of adaptively controlling resistivity of claim 16, wherein the buffer layer is epitaxially grown as having a graded dopant profile, wherein dopant concentration is lowest at the substrate and progressively greater further away from the substrate.

19. The method of adaptively controlling resistivity of claim 12, wherein the substrate is silicon carbide.

20. The method of adaptively controlling resistivity of claim 19, wherein the buffer layer is gallium nitride.

21. The method of adaptively controlling resistivity of claim 12, wherein the buffer layer is epitaxially grown as having sublayers of different respective dopant concentration.

22. The method of adaptively controlling resistivity of claim 12, wherein the buffer layer is epitaxially grown as having a graded dopant profile.

23. The method of adaptively controlling resistivity of claim 12, wherein the substrate is silicon carbide, the buffer layer is gallium nitride and the buffer layer dopant is carbon.

24. The method of adaptively controlling resistivity of claim 12, wherein the initial resistivity of the substrate is not less than $10^3$ ohms/cm.

* * * * *